United States Patent
Oh et al.

(10) Patent No.: US 12,501,636 B2
(45) Date of Patent: Dec. 16, 2025

(54) POWER SEMICONDUCTOR DEVICE CAPABLE OF CONTROLLING SLOPE OF CURRENT AND VOLTAGE DURING DYNAMIC SWITCHING

(71) Applicant: TRinno Technology Co., Ltd., Seoul (KR)

(72) Inventors: Kwang Hoon Oh, Seoul (KR); Junyoung Choi, Seoul (KR); Jin Young Jung, Seoul (KR); Soo Seong Kim, Seoul (KR); Chongman Yun, Seoul (KR)

(73) Assignee: Trinno Technology Co., Ltd., Seoul (KR)

( * ) Notice: Subject to any disclaimer, the term of this patent is extended or adjusted under 35 U.S.C. 154(b) by 741 days.

(21) Appl. No.: 17/835,231

(22) Filed: Jun. 8, 2022

(65) Prior Publication Data

US 2023/0215938 A1 Jul. 6, 2023

(30) Foreign Application Priority Data

Dec. 30, 2021 (KR) ........................ 10-2021-0193274

(51) Int. Cl.
*H10D 12/00* (2025.01)
*H03K 17/567* (2006.01)
*H10D 62/10* (2025.01)
*H10D 89/00* (2025.01)

(52) U.S. Cl.
CPC ......... *H10D 12/481* (2025.01); *H03K 17/567* (2013.01); *H10D 62/127* (2025.01); *H10D 89/215* (2025.01)

(58) Field of Classification Search
None
See application file for complete search history.

(56) References Cited

U.S. PATENT DOCUMENTS

2021/0043759 A1  2/2021 Philippou et al.
2023/0215938 A1* 7/2023 Oh ...................... H03K 17/567
                                                257/355

* cited by examiner

*Primary Examiner* — Jack S Chen
(74) *Attorney, Agent, or Firm* — Grossman, Tucker, Perreault & Pfleger, PLLC; Donald J. Perreault (57) ABSTRACT

Power semiconductor device capable of controlling slope of current and voltage during dynamic switching disclosed. The power semiconductor device may include a semiconductor substrate and a cell array being consisted of a plurality of transistor cells on an active area, wherein each of the plurality of transistor cells may include an emitter region, a body region, a contact region and a gate region, wherein non-uniform threshold voltages may be respectively set in the plurality of transistor cells constituting the cell array, wherein a gate signal may be applied to each of the plurality of transistor cells through an input/output unit, wherein the input/output unit may include a first gate signal path configured for supplying a gate charging current to the gate regions in each of the plurality of transistor cells and a second gate signal path configured for discharging a gate discharging current from the gate region.

10 Claims, 10 Drawing Sheets

Threshold Voltage : Vth1(TC-gr1) < Vth2(TC_gr2) < Vth3(TC_gr3)

———————— Switching On ————————▶
◀——————— Switching Off ———————

POWER SEMICONDUCTOR DEVICE CAPABLE OF CONTROLLING SLOPE OF CURRENT AND VOLTAGE DURING DYNAMIC SWITCHING

FIELD

The present invention relates to power semiconductor device capable of controlling slope of current and voltage during dynamic switching

RELATED ART

Power semiconductor devices, which are important elements in the field of power electronics, such as an insulated-gate bipolar transistors (IGBTs), metal-oxide-semiconductor field effect transistors (MOSFETs) and various types of thyristors, are being developed to satisfy requirements of various industrial applications (e.g., high breakdown voltage, low conduction loss, high switching speed, low switching loss, etc.) as well as automotive applications.

As an example of a power semiconductor device, the IGBT typically includes a semiconductor body configured to conduct a load current along a load current path between two load terminals, the load current path being controlled by an insulated-gate electrode. For example, upon receiving a corresponding control signal from a gate driver circuit, the gate electrode may set the IGBT to one of a conducting state and a blocking state.

In some cases, the gate electrode may be contained within a trench of the IGBT, which trench may have, for example, a stripe pattern configuration or a cellular type configuration in an active region consisted of transistor cells (TCs).

In general, it is desirable to keep IGBT loss, such as switching loss, as low as possible. Low switching loss can be achieved by ensuring fast switching operations, namely, short switching transients (e.g., short turn-on time and/or short turn-off time).

However, the high-speed switching operation for achieving low IGBT losses may cause a problem of EMI (Electro Magnetic Interference) noise due to the di/dt slope and/or the dV/dt slope. In addition, the high-speed switching operation may cause voltage spikes, gate oscillations and so on induced by parasitic inductance effect in the circuit.

As such, in a power semiconductor device having a gate structure, it is difficult to achieve the desired level of di/dt slope and/or dV/dt slope characteristics during a switching operation, and when an excessive gate resistance is used in the gate driver circuit, there is a problem in that the switching loss rapidly increases.

The above-mentioned related art is technical information possessed by the inventor for derivation of the present invention or acquired in the derivation process of the present invention, and cannot necessarily be said to be a known technique disclosed to the general public prior to the filing of the present invention.

SUMMARY

The present invention is for providing a power semiconductor device capable of controlling a slope of current and voltage during a dynamic switching for achieving a target switching transient by adjusting a current response characteristics to a gate input voltage inside of the device.

The present invention is for also providing a power semiconductor device capable of controlling a slope of current and voltage during a dynamic switching for achieving a switching loss, dV/dt slope and/or di/dt slope characteristics that meet the requirements for a given application.

Other objects of the present invention will be easily understood through the following description.

According to one aspect of the present invention there is provided a power semiconductor device. The power semiconductor device may include a semiconductor substrate and a cell array being consisted of a plurality of transistor cells on an active area, wherein each of the plurality of transistor cells may include an emitter region, a body region, a contact region and a gate region, wherein non-uniform threshold voltages may be respectively set in the plurality of transistor cells constituting the cell array, wherein a gate signal may be applied to each of the plurality of transistor cells through an input/output unit, wherein the input/output unit may include a first gate signal path configured for supplying a gate charging current to the gate region in each of the plurality of transistor cells and a second gate signal path configured for discharging a gate discharging current from the gate region.

The power semiconductor device may be switched on by turning on from the transistor cell in which the threshold voltage is set to be relatively low in response to the gate signal applied to each of the plurality of transistor cells and the power semiconductor device may be switched off by turning off from the transistor cell in which the threshold voltage is set to be relatively high.

The plurality of transistor cells may have non-uniform widths in a lateral direction of the emitter region in order to set non-uniform threshold voltages in the plurality of transistor cells.

The plurality of transistor cells may have non-uniform separation distances between the emitter region and the contact region in order to set non-uniform threshold voltages in the plurality of transistor cells.

The plurality of transistor cells may have non-uniform separation distances between the contact region and the gate region in order to set non-uniform threshold voltages in the plurality of transistor cells.

The input/output unit may include a common gate node electrically coupled to a gate pad, a first intermediate node and a second intermediate node electrically connected to each of the gate regions of the plurality of transistor cells included in the cell array, a turn-on diode, which is an on-chip diode, disposed in the first gate signal path, which is between the common gate node and the first intermediate node, in order to supply the gate charging current to the gate regions of the plurality of transistor cells and a turn-off diode, which is an on-chip diode, disposed in the second gate signal path, which is between the common gate node and the second intermediate node, in order to discharge the gate discharging current from the gate regions of the plurality of transistor cells, wherein the first intermediate node and the second intermediate node may be electrically coupled to each other, and the turn-on diode and the turn-off diode may be coupled to each other in opposite directions.

A resistor may be disposed in at least one of a path between the first intermediate node and the second intermediate node, the first gate signal path, and the second gate signal path.

The resistor disposed in the first gate signal path and the resistor disposed in the second gate signal path may have different resistance values.

The power semiconductor device may be a MOSFET transistor or an insulated-gate bipolar transistor.

Aspects, features, advantages other than above described will be apparent from the following drawings, claims and detailed description.

According to the present invention, it is advantageous that a target switching transient by adjusting a current response characteristics to a gate input voltage inside of the device can be achieved.

It is also advantageous that a switching loss, dV/dt slope and/or di/dt slope characteristics that meet the requirements for a given application can be achieved.

DESCRIPTION OF EMBODIMENTS

The invention can be modified in various forms and specific embodiments will be described and shown below. However, the embodiments are not intended to limit the invention, but it should be understood that the invention includes all the modifications, equivalents, and replacements belonging to the concept and the technical scope of the invention. In describing the present invention, if it is determined that a detailed description of a related known technology may obscure the gist of the present invention, the detailed description thereof will be omitted.

Terms such as first, second, etc., may be used to refer to various elements, but, these element should not be limited due to these terms. These terms will be used to distinguish one element from another element.

The terms used in the following description are intended to merely describe specific embodiments, but not intended to limit the invention. An expression of the singular number includes an expression of the plural number, so long as it is clearly read differently. The terms such as "include" and "have" are intended to indicate that features, numbers, steps, operations, elements, components, or combinations thereof used in the following description exist and it should thus be understood that the possibility of existence or addition of one or more other different features, numbers, steps, operations, elements, components, or combinations thereof is not excluded.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

Relative terms, such as "below" or "above" or "upper" or "lower" or "horizontal" or "lateral" or "vertical" may be used herein to describe-one element, layer or region's relationship to another elements, layers or regions as illustrated in the Figures. It will be understood that relative terms are intended to encompass different orientations of the device in addition to the orientation depicted in the Figures.

Hereinafter, an embodiment of the present invention will be described in detail with reference to the accompanying drawings. However, in the following description, the insulated-gate bipolar transistor (IGBT) will be mainly described, but it should be understood that the technical concept of the present invention may be applied and expanded to various types of semiconductor devices such as power MOSFETs in the same or similar manner. In addition, although the trench gate IGBT will be mainly described below for convenience of description, it should be also understood that the technical spirit of the present invention can be universally applied and extended to various gate structures such as a planar gate structure.

Figure 1:
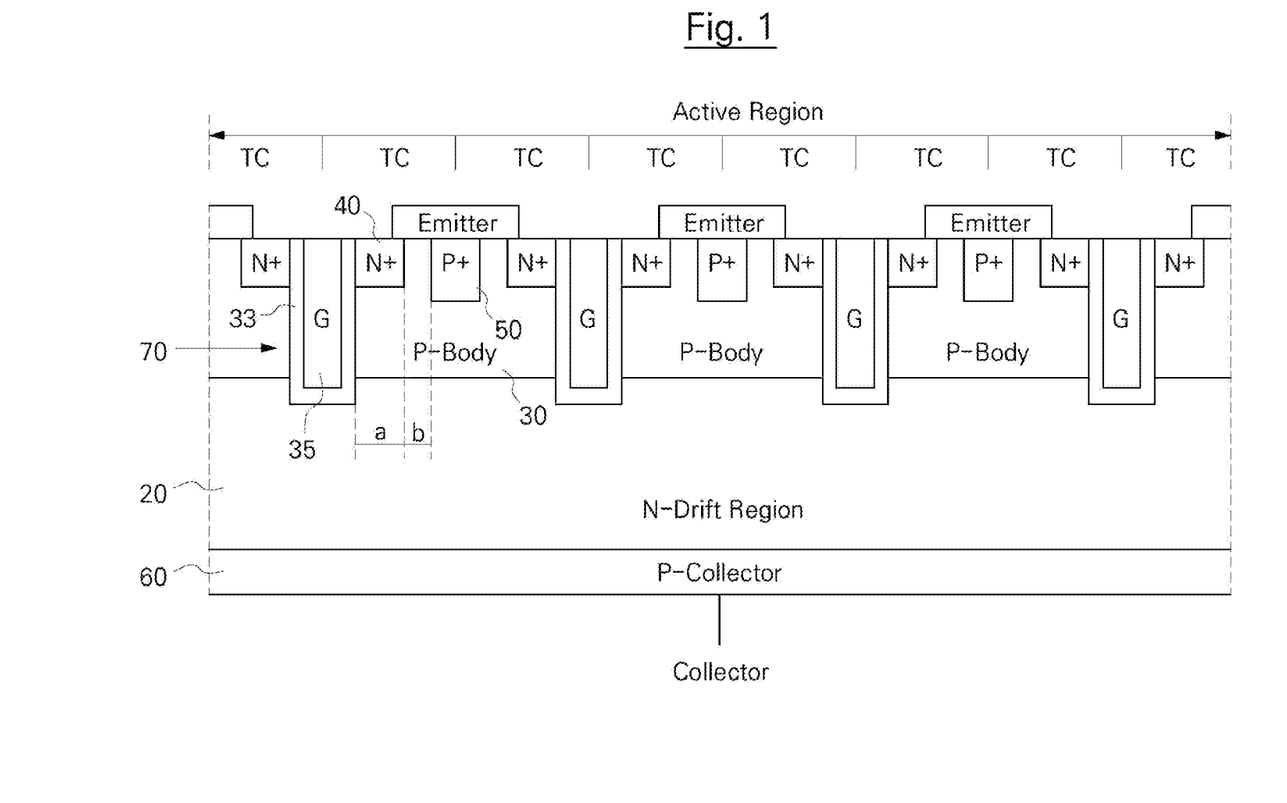
FIG. 1 exemplarily illustrates a cross-sectional view of conventional trench IGBT.

FIG. 1 exemplarily illustrates a cross-sectional view of conventional trench IGBT.

Referring to FIG. 1, the conventional trench gate IGBT includes an N type drift region 20, a P type body region 30, an N+ type emitter region 40, a P+ type contact region 50, a P type collector region 60 and a gate region 70.

The gate region 70 may include a trench extending from the emitter region 40 to the N- type drift region 20, an insulating layer 33 formed on inner surfaces of the trench, and a conductive polysilicon gate 35 formed in the trench. The conductive polysilicon gate 35 is electrically coupled to an external electrode terminal G (not shown).

A cell array consisted of a plurality of transistor cells TCs having the same structure is provided in an active region of the IGBT. Each of the transistor cells TCs may include the emitter region 40, the body region 30, the contact region 50, and the gate region 70.

As shown in FIG. 1, in each transistor cell TC, which is located in the active region of the IGBT, a width of the emitter region 40 in the lateral direction (a in FIG. 1) and a separation distance between the emitter region 40 and the contact region 50 (b in FIG. 1) are all set to be the same. For this reason, all the transistor cells TCs provided in the IGBT are switched on/off at the same threshold voltage.

Therefore, in the conventional IGBT, it is difficult to achieve a desired level of di/dt slope and/or dV/dt slope characteristics during switching on/off operation, and when an excessive gate resistance is used in or with a gate driver, a switching loss may increase sharply.

Figure 2:
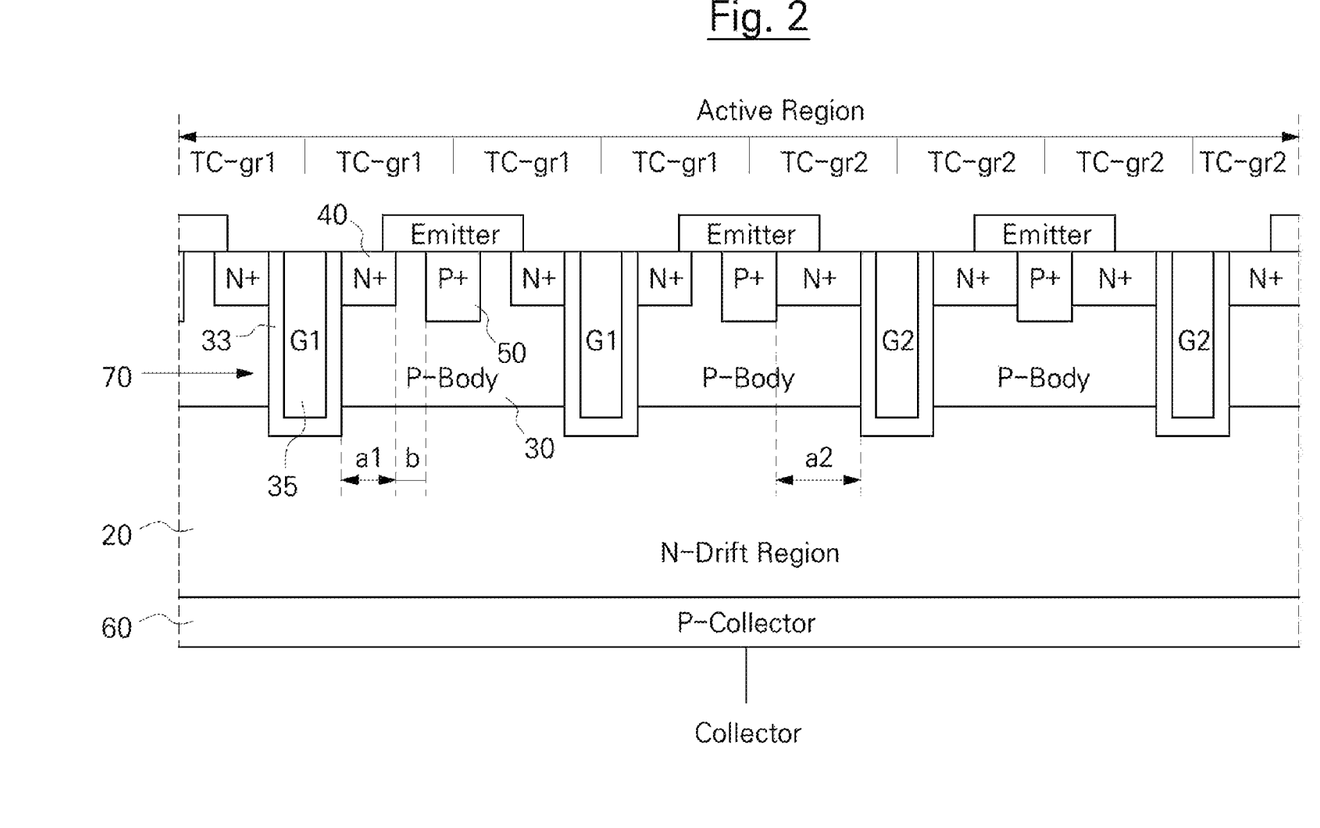
FIG. 2 and FIG. 3 exemplarily illustrate cross-sectional views of trench gate IGBT according to each embodiment of the present invention.
Figure 3:
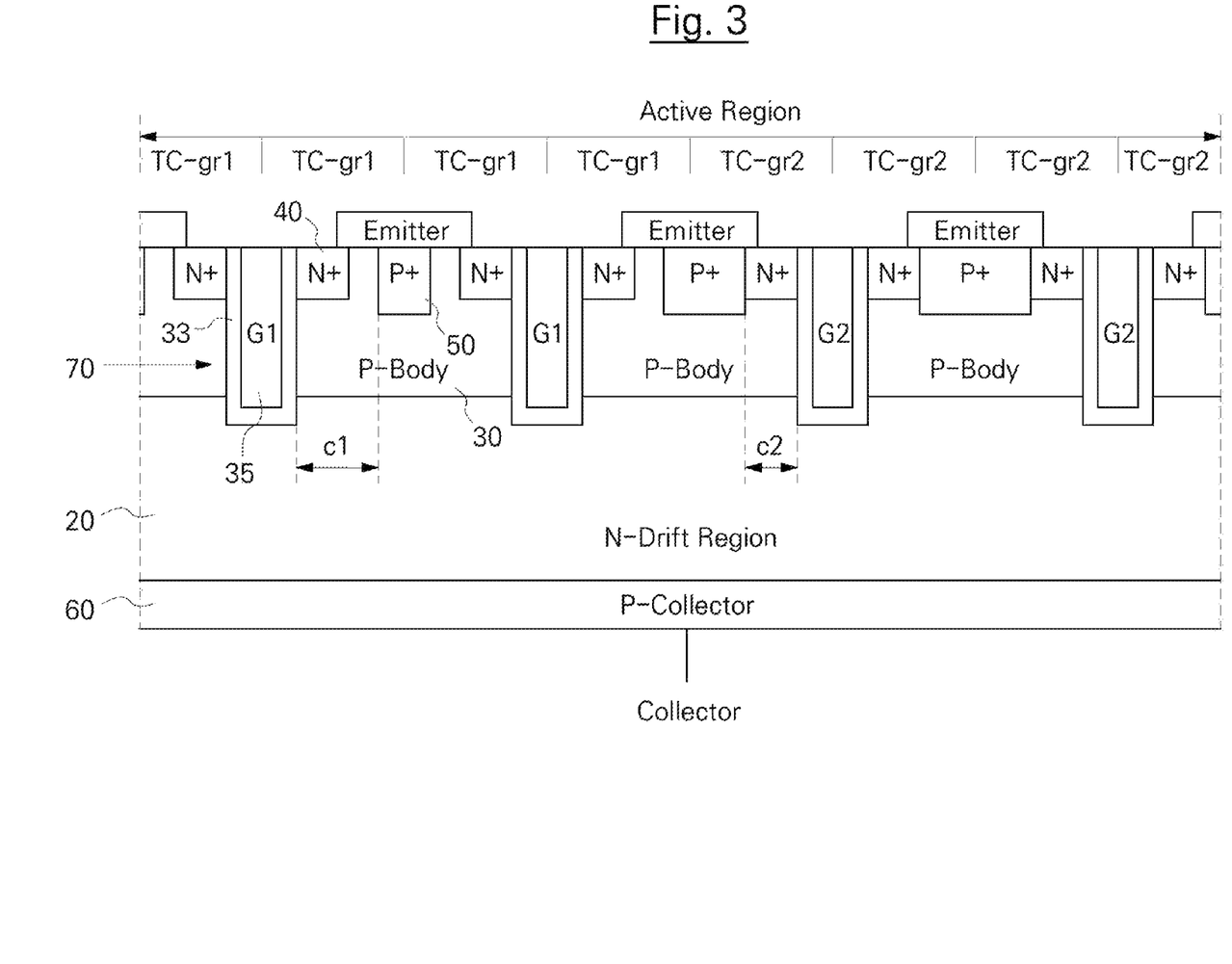
Figure 4:
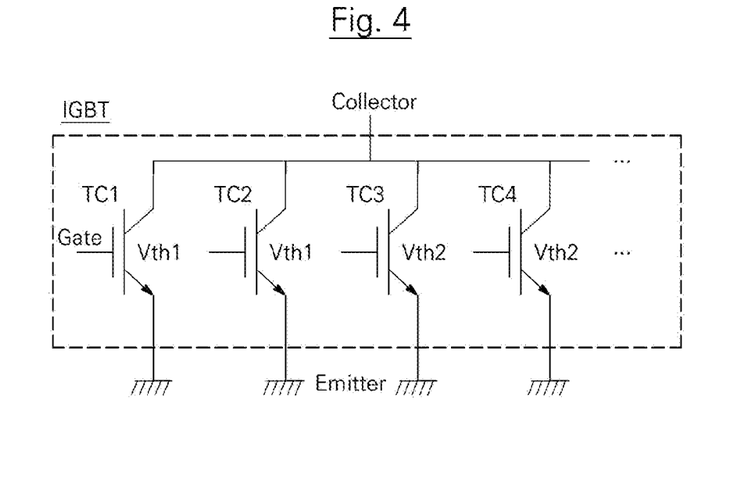
FIG. 4 and FIG. 5 exemplarily illustrate an IGBT provided with transistor cells of which threshold voltages are non-uniformly set according to one embodiment of the present invention.
Figure 5:
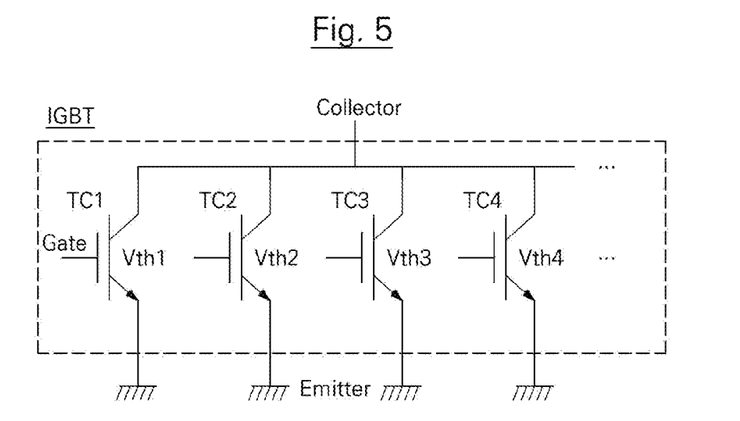

FIGS. 2 and 3 exemplarily illustrate cross-sectional views of trench gate IGBT according to each embodiment of the present invention, FIG. 4 and FIG. 5 exemplarily illustrate an IGBT provided with transistor cells TCs of which threshold voltages are non-uniformly set according to one embodiment of the present invention.

Figure 6:
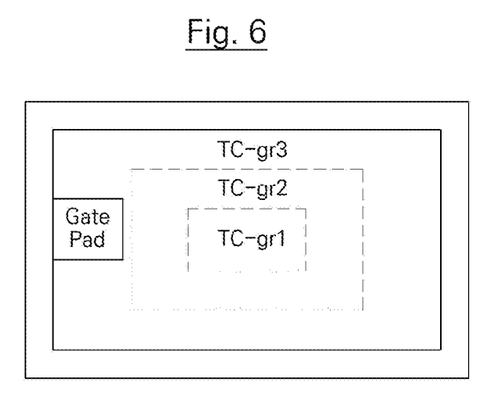
FIG. 6 and FIG. 7 exemplarily illustrate an arrangement and an operation state of transistor cells of which threshold voltages are set non-uniformly according to one embodiment of the present invention.
Figure 7:
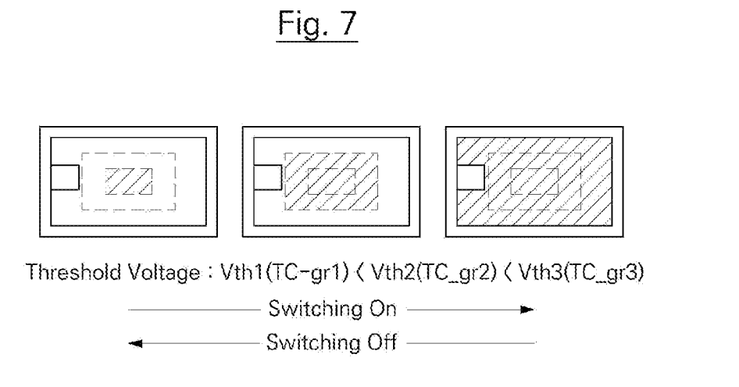
Figure 8:
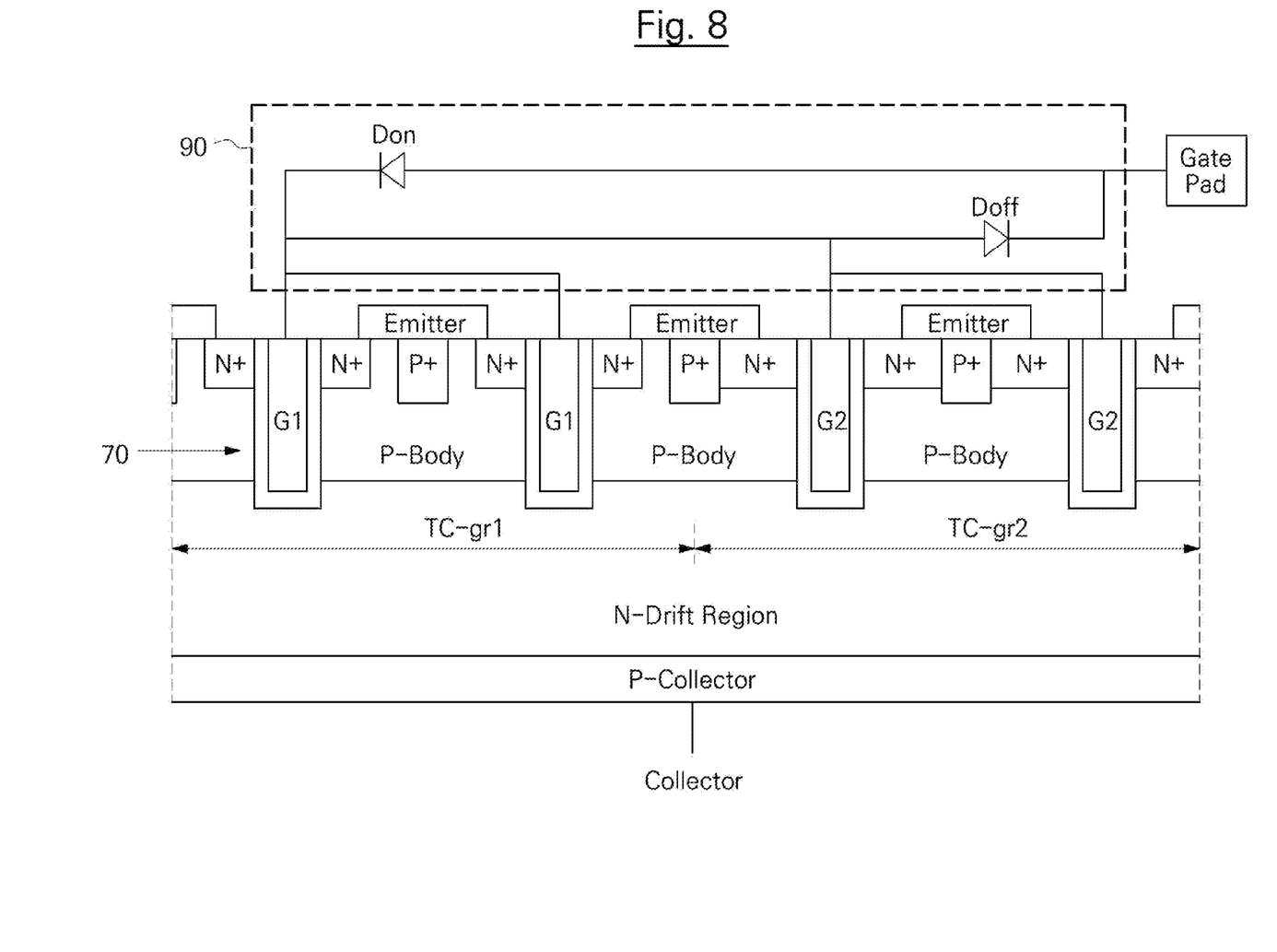
FIG. 8 exemplarily illustrates an IGBT having an on-chip input/output unit according to one embodiment of the present invention.
Figure 9:
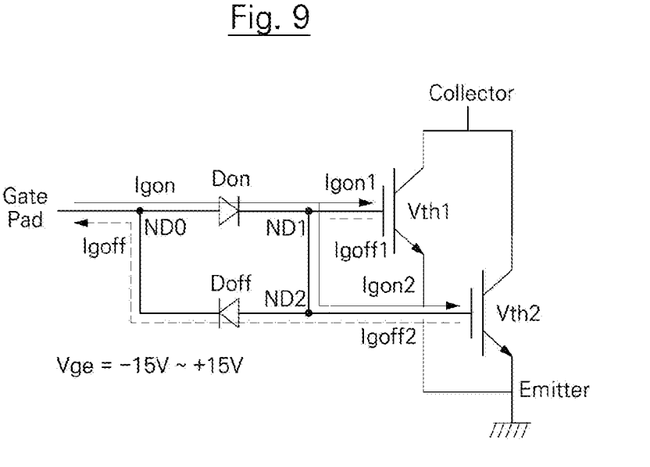
FIG. 9, FIG. 10 and FIG. 11 exemplarily illustrate various modifications of the input/output unit according to one embodiments of the present invention.
Figure 10:
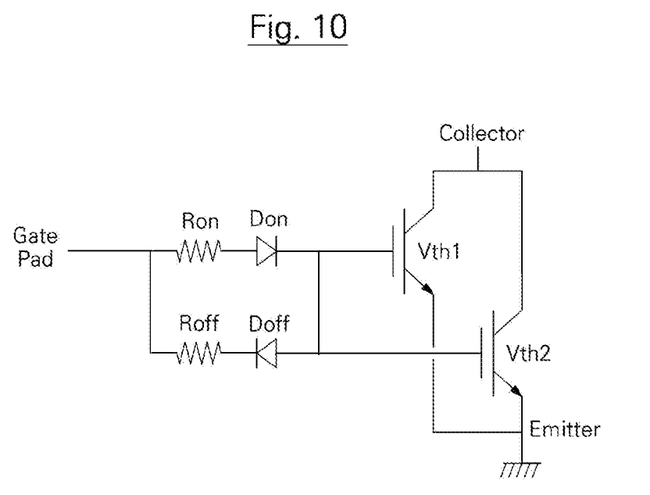
Figure 11:
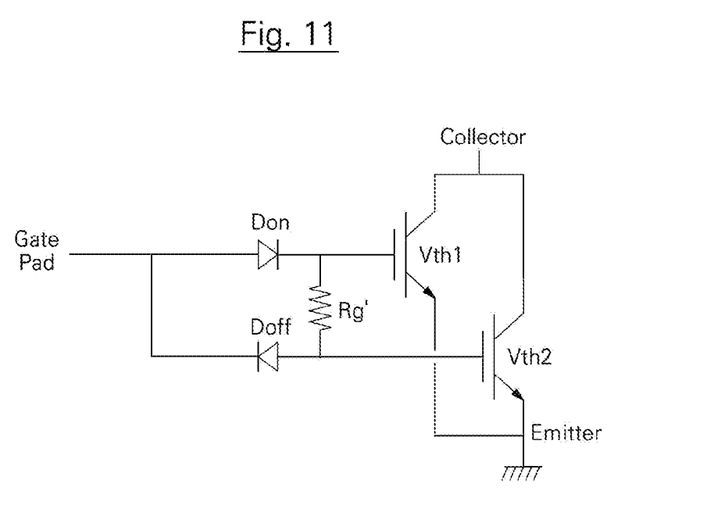
Figure 12:
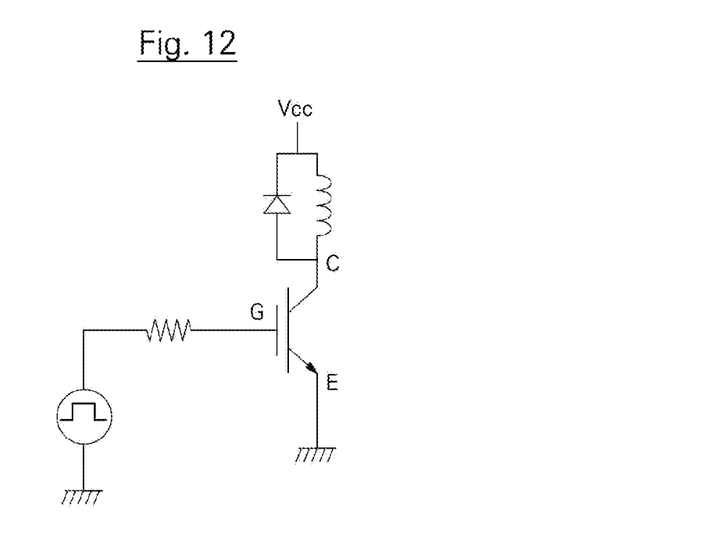
FIG. 12 and FIG. 13 exemplarily illustrate a switching waveform of an IGBT under inductive load condition according to one embodiment of the present invention.
Figure 13:
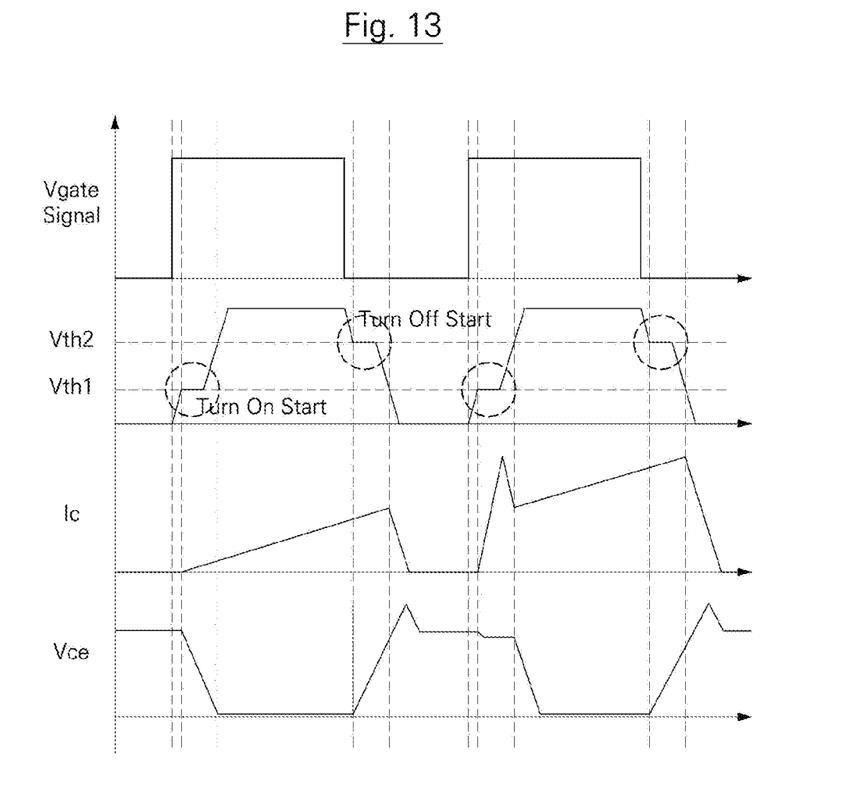
Figure 14:
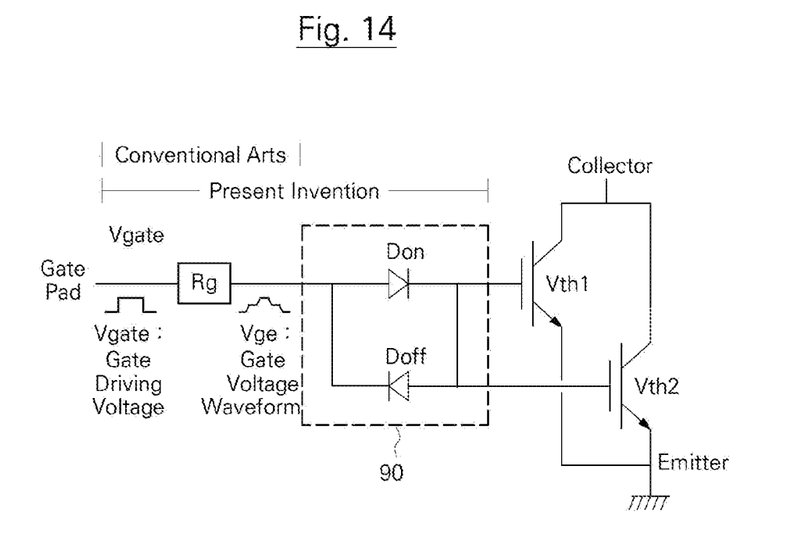
FIG. 14 exemplarily illustrates a differentiation of a method of controlling a gate voltage waveform from a conventional method in an IGBT according to one embodiment of the present invention.

FIG. 6 and FIG. 7 exemplarily illustrate an arrangement and an operation state of transistor cells TCs of which threshold voltages are set non-uniformly according to one embodiment of the present invention, FIG. 8 exemplarily illustrates an IGBT having an on-chip input/output unit according to one embodiment of the present invention, FIG. 9, FIG. 10 and FIG. 11 exemplarily illustrate various modifications of the input/output unit according to one embodiments of the present invention, FIG. 12 and FIG. 13 exemplarily illustrate a switching waveform of an IGBT under inductive load condition according to one embodiment of the present invention, and FIG. 14 exemplarily illustrates a differentiation of a method of controlling a gate voltage waveform from a conventional method in an IGBT according to one embodiment of the present invention. As mentioned above, the IGBT according to the present embodiment may have a planar gate, but hereinafter, for convenience of description, the trench gate IGBT will be mainly described.

Referring to FIG. 2 and FIG. 3, the trench gate IGBT according to the present embodiment is provided with a cell array consisting of a plurality of transistor cells TCs in an active region, and the transistor cells TCs consisting of the cell array are set to have non-uniform threshold values.

In order to set the non-uniform threshold voltages, process parameters for forming the transistor cells TCs included in the IGBT may be different, or some structures of the transistor cells TCs may be changed.

That is, as illustrated in FIGS. 2 and 3, in order to enable each of the transistor cells TCs included in the IGBT to be respectively set to intended threshold voltages, widths in the lateral direction in the emitter region 40 may be non-uniform (a1 and a2 in FIG. 2), or separation distances between the emitter region 40 and the contact region 50 (b in FIG. 2) may be non-uniform, or separation distances between the contact region 50 and the gate region 70 is non-uniform (c1 and c2 in FIG. 3).

As one example, as illustrated in FIG. 2, the transistor cells TCs may be formed to have P+ type contact regions 50 of which size and the separation distance from the gate region 70 are uniform and N+ type emitter regions 40 of which widths in the lateral direction are non-uniform.

In the first group transistor cells TC-gr1 in which the emitter region 40 is formed to be spaced apart from the contact region 50, the contact region 50 diffuses in the lateral direction during a heat treatment process for manufacturing the IGBT. As a result, an ion concentration in a region between the contact region 50 and the emitter region 40 (the region indicated by b in FIG. 2) may become relatively higher than that of the P type body region 30 (namely, channel concentrations are differentiated).

As such, by forming widths in the lateral direction of the emitter region 40 in contact with the contact region 50 in the second group transistor cells TC-gr2 to be different from widths in the lateral direction of the emitter region 40 in the first group transistor cells TC-gr1, an influence of the lateral diffusion from the contact region 50 due to the heat treatment may be adjusted.

That is, in the case of the IGBT shown in FIG. 2, by forming the emitter region 40 of the second group transistor cells TC-gr2 to have a relatively wide lateral width (a1<a2), the influence of the lateral diffusion of the contact region 50 may be reduced, thereby the threshold voltage being set relatively low (threshold voltage Vth_gr2 of the second group transistor cells TC-gr2<threshold voltage Vth_gr1 of the first group transistor cells TC-gr1).

As another example, as illustrated in FIG. 3, the transistor cells TCs may be formed to have N+ type emitter regions 40 of which width in the lateral direction is uniform and P+ type contact regions 50 of which sizes and positions are non-uniform. Namely, the contact region 50 may be formed or shifted from its original position to be in contact with at least one of the emitter regions 40 in the lateral direction, or not in contact with the emitter regions 40.

In this case, by adjusting the separation distance between the contact region 50 and the gate region 70, when the contact region 50 is diffused in the lateral direction according to the heat treatment process, a peak concentration of the channel region may be adjusted, thereby controlling the threshold voltage of the corresponding transistor cell TC.

That is, in the case of the IGBT shown in FIG. 3, by forming the separation distance c1 between the contact region 50 and the gate region 70 of the first group transistor cells TC-gr1 to be relatively longer than the separation distance c2 between the contact region 50 and the gate region 70 of the second group transistor cells TC-gr2, the first group transistor cells TC-gr1 come to have relatively low peak concentration in the channel region, thereby the threshold voltage being set relatively low (threshold voltage Vth_gr1 of the first group transistor cells TC-gr1<threshold voltage Vth_gr2 of the second group transistor cells TC-gr2).

As described above, the IGBT according to the present embodiment may be set to have non-uniform threshold voltages by non-uniformly generating process parameters and/or cell configurations of the provided transistor cells TCs (for example, at least one of non-uniformity in the width of the emitter region 40 in the lateral direction, non-uniform separation distance between the emitter region 40 and the contact region 50 and/or non-uniform separation distance between the contact region 50 and the gate region 70).

In this case, the transistor cells TCs in the IGBT may be set to a common threshold voltage in a group unit to which one or more transistor cells TCs belong (for example, the first group transistor cells TCs are set to threshold voltage Vth1, the second group transistor cells TCs are set to threshold voltage Vth2), as illustrated in FIG. 4.

In addition, as illustrated in FIG. 5, the threshold voltages of each transistor cells TCs may be set to have different threshold voltages (for example, the first transistor cell is set to threshold voltage Vth1, the second transistor cell is set to threshold voltage Vth2).

In FIG. 6, the transistor cells TCs in the active region of the IGBT are divided into three groups TC-gr1, TC-gr2, TC-gr3 according to the threshold voltages. It is assumed that the relationship of the threshold voltages of the transistor cells TCs belonging to each group is Vth1(TC-gr1)<Vth2(TC-gr2)<Vth3(TC-gr3).

In this case, when the switching on/off operation of the IGBT is performed by gradually increasing or decreasing the gate voltage, as illustrated in FIG. 7, transistor cells TCs belonging to a group having a relatively low threshold voltage start being sequentially turned on, and transistor cells TCs belonging to a group having a relatively high threshold voltage start being sequentially turned off.

For reference, in FIG. 7, each of the transistor cells TCs disposed in the active region is defined to belong to one of the first to third groups, the first group having the lowest threshold voltage is surrounded by the second group having relatively high threshold voltage, and the second group is surrounded by the third group having the highest threshold voltage.

In this arrangement, in the switching-on operation of the IGBT, the transistor cells TCs of the first group being disposed the innermost region and having the relatively low threshold voltage start being turned on to widen a turn-on region around them, and in the switching-off operation of the IGBT, the transistor cells TCs of the third group disposed on the outermost region start being turned off, thereby narrowing the turn-on region toward the center thereof.

FIG. 8 exemplarily illustrates an IGBT having an on-chip input/output unit 90. The input/output unit 90 is configured for electrically connecting the gate regions 70 disposed in each of the transistor cells TCs and a gate pad, and provides the first gate signal path for supplying a gate charging current to the gate regions 70 in each of the transistor cells TCs and the second gate signal path for discharging a gate discharging current from the gate regions 70.

As illustrated in FIG. 9, in the input/output unit 90, a turn-on diode Don that is an on-chip diode is disposed between a common gate node ND0 and the first intermediate node ND1 in position for supplying the gate charging current Igon to the transistor cells TCs, and a turn-off diode Doff that is an on-chip diode is disposed between the common gate node ND0 and the second intermediate node ND2 in position for discharging the gate discharging current Igoff from the transistor cells TCs. That is, the turn-on diode Don and the turn-off diode Doff are disposed in opposite directions to each other so that the current flow direction is reversed.

In addition, the first intermediate node ND1 and the second intermediate node ND2 are electrically coupled to each other, and each of the first and second intermediate nodes ND1 and ND2 is electrically connected to the gate regions 70 in each of the transistor cells TCs.

Accordingly, the gate charging current Igon input to the common gate node ND0 flows through the first gate signal path in which the turn-on diode Don is disposed to be supplied to each of transistor cells TCs coupled to the first and the second intermediate nodes ND1, ND2, thereby turning on each of transistor cells TCs at the threshold voltage.

Conversely, during the switching-off operation of the IGBT, the gate discharging currents Igoff1 and Igoff2 input to the first and second intermediate nodes ND1 and ND2 flow through the second gate signal path in which the turn-off diode Doff is disposed to be emitted through the common gate node ND0.

Although not shown, the input/output unit 90 may be formed by disposing the on-chip diode on a gate line connecting the gate pad of IGBT, which is a vertical power semiconductor.

The operation of the input/output unit 90 will be briefly described with reference to FIG. 9. For convenience of explanation, it is assumed that the first group transistor cells that are 50% of the transistor cells TCs arranged in the active region of the IGBT are set to the threshold voltage Vth1 (=5V), and the second group transistor cells that are the remaining 50% of the transistor cells TCs are set to the threshold voltage Vth2 (=7V).

During the switching-on operation of the IGBT, the gate charging current Igon is applied to the transistor cells belonging to each of the first group and the second group through the first gate signal path in which the turn-on diode Don is disposed, turns on the transistor cells of the first group at the threshold voltage of 5V, and turns on the transistor cells of the second group at the threshold voltage of 7V as the gate voltage further increases, so that all the transistor cells TCs included in the IGBT are turned on. As described above, by non-uniformly setting the threshold voltages of the transistor cells TCs provided in the IGBT, an intentional delay may occur during the switching-on operation of the IGBT.

In a similar concept to this, during the switching-off operation of the IGBT in which the gate voltage is applied up to −15V, the gate-off current Igoff flows through the second gate signal path in which the turn-off diode Doff is disposed. In this case, the second group transistor cells with a relatively high threshold voltage are first turned off at 7V, and as the gate voltage continues to decrease, the first group transistor cells are also turned off at 5V, so that all transistor cells TCs are turned off. As described above, by non-uniformly setting the threshold voltages of the transistor cells TCs provided in the IGBT, an intentional delay can be generated even during the switching-off operation of the IGBT.

As described above, the IGBT in which the threshold voltages for the transistor cells TCs are set non-uniformly to operate in opposite concepts during the switching-on operation and the switching-off operation. A gate reference voltage at which the transistor cells TCs are turned on is Vth1 during the switching-on operation, a gate reference voltage at which the transistor cells TCs are turned off becomes Vth2 during the switching-off operation, and the IGBT has different effective threshold voltages during the switching on/off operation. (See the switching circuit illustrated in FIG. 12 and switching on/off waveforms illustrated in FIG. 13).

The input/output unit 90 may further include one or more of a turn-on resistor Ron, a turn-off resistor Roff, and a common resistor Rg' in order to more variously control the switching characteristics of the IGBT.

For example, as illustrated in FIG. 10, the turn-on resistor Ron may be coupled in series with the turn-on diode Don in the first gate signal path (i.e., the path between the common gate node ND0 and the first intermediate node ND1), and the turn-off resistor Roff may be coupled in series with the turn-off diode Doff in the second gate signal path (i.e., the path between the common gate node ND0 and the second intermediate node ND2). In this case, the factors affecting the switching characteristics of all transistor cells TCs during the switching-on operation of the IGBT may be defined as Ron/Don, and the factors affecting the switching characteristics of all the transistor cells TCs during the switching-off operation of the IGBT may be defined as Doff/Roff. Here, the resistance of the turn-on resistor and the turn-off resistor may be preset to be the same or different.

As another example, as illustrated in FIG. 11, the common resistor Rg' may be disposed to couple the first intermediate node ND1 of the first gate signal path and the second intermediate node ND2 of the second gate signal path. In this case, during the switching-on operation of the IGBT, the factors affecting the switching characteristics for the transistor cells belonging to the first group may be defined as Don, and the factors affecting the switching characteristics for the transistor cells belonging to the second group may be defined as Don/Rg'. In addition, during the switching-off operation of the IGBT, the factors affecting the switching characteristics for the transistor cells belonging to the first group may be defined as Rg'/Doff, and the switching characteristic influence factor for the transistor cells belonging to the second group may be defined as Doff.

Of course, it goes without saying that the turn-on resistor Ron, the turn-off resistor Roff, and the common resistor Rg' may be arranged in various connection relationships in order to control the IGBT with appropriate switching characteristics.

FIG. 14 shows the difference between the method of controlling the gate voltage waveform of the conventional IGBT and the IGBT according to the embodiments of the present invention.

In general, when driving the IGBT in switching operation, a method of controlling the transmission of the gate signal by adjusting the resistance or impedance of the gate input terminal and controlling the gate voltage directly applied to the gate region of the transistor cell TC is applied. Through this, a target switching transient characteristic can be achieved by controlling the di/dt slope and the dV/dt slope when the power semiconductor device is switched on/off.

However, the above-described conventional method of driving the IGBT in switching operation is the method of controlling the finally applied gate voltage, and has a limitation in not being able to control an intrinsic current response characteristic according to the gate voltage. The current response characteristic may be determined by a design and manufacturing process.

In addition, in the above-described conventional method of driving the IGBT in switching operation, it is difficult to easily achieve desired levels of di/dt slope and/or dV/dt slope characteristics during the switching operation, and when excessive resistance is used in the gate driving circuit, there is also a problem in that the switching loss rapidly increases.

In contrast, in the power semiconductor device according to the embodiments of the present invention, by applying the gate signal to each transistor cell TC through the input/output unit 90 including the first and second gate signal paths, it is possible to variously adjust the current response characteristics to the gate input voltage inside the power semiconductor device, thereby providing an expanded degree of freedom and achieving a target switching transient characteristic.

As described above, in the power semiconductor device according to embodiments of the present invention, by non-uniformly setting threshold voltages of transistor cells TCs in the active region and separating the first gate signal path through which the gate charging signal passes during the switching-on operation from the second gate signal path through which the gate discharging signal passes during the switching-off operation, the transistor cells TCs may be sequentially turned on/off according to set threshold voltage values, so that slopes of voltage and current waveforms may be smoothly adjusted during the switching on/off operation of the power semiconductor device.

Up to now, the power semiconductor device has been described using the IGBT as an example, but it should be understood that the technical concept of the present invention may be applied and expanded to various types of power semiconductor devices such as power MOSFETs in the same or similar manner.

Although the above has been described with reference to the embodiments of the present invention, those of ordinary skill in the art can variously modify the present invention without departing from the spirit and scope of the present invention described in the claims below.

What is claimed is:

1. A power semiconductor device, comprising:
a semiconductor substrate; and
a cell array being consisted of a plurality of transistor cells on an active area,
wherein each of the plurality of transistor cells comprises an emitter region, a body region, a contact region and a gate region,
wherein non-uniform threshold voltages are respectively set in the plurality of transistor cells constituting the cell array,
wherein a gate signal is applied to each of the plurality of transistor cells through an input/output unit,
wherein the input/output unit comprises a first gate signal path configured for supplying a gate charging current to the gate region in each of the plurality of transistor cells and a second gate signal path configured for discharging a gate discharging current from the gate region.

2. The power semiconductor device of claim 1, wherein the power semiconductor device is switched on by turning on from the transistor cell in which the threshold voltage is set to be relatively low in response to the gate signal applied to each of the plurality of transistor cells and the power semiconductor device is switched off by turning off from the transistor cell in which the threshold voltage is set to be relatively high.

3. The power semiconductor device of claim 1, wherein the plurality of transistor cells has non-uniform widths in a lateral direction of the emitter region in order to set non-uniform threshold voltages in the plurality of transistor cells.

4. The power semiconductor device of claim 1, wherein the plurality of transistor cells has non-uniform separation distances between the emitter region and the contact region in order to set non-uniform threshold voltages in the plurality of transistor cells.

5. The power semiconductor device of claim 1, wherein the plurality of transistor cells has non-uniform separation distances between the contact region and the gate region in order to set non-uniform threshold voltages in the plurality of transistor cells.

6. The power semiconductor device of claim 1, wherein the input/output unit comprises:
a common gate node electrically coupled to a gate pad;
a first intermediate node and a second intermediate node electrically connected to each of the gate regions of the plurality of transistor cells included in the cell array;
a turn-on diode, which is an on-chip diode, disposed in the first gate signal path, which is between the common gate node and the first intermediate node, in order to supply the gate charging current to the gate regions of the plurality of transistor cells; and
a turn-off diode, which is an on-chip diode, disposed in the second gate signal path, which is between the common gate node and the second intermediate node, in order to discharge the gate discharging current from the gate regions of the plurality of transistor cells,
wherein the first intermediate node and the second intermediate node are electrically coupled to each other, and the turn-on diode and the turn-off diode are coupled to each other in opposite directions.

7. The power semiconductor device of claim 6, wherein a resistor is disposed in at least one of a path between the first intermediate node and the second intermediate node, the first gate signal path, and the second gate signal path.

8. The power semiconductor device of claim 7, wherein the resistor disposed in the first gate signal path and the resistor disposed in the second gate signal path have different resistances.

9. The power semiconductor device of claim 1 is a MOSFET transistor.

10. The power semiconductor device of claim 1 is an insulated-gate bipolar transistor.

\* \* \* \* \*